United States Patent [19]

Chesemore et al.

[11] 4,196,959
[45] Apr. 8, 1980

[54] CARRIER STRIP FOR ROUND LEAD PINS AND METHOD FOR MAKING THE SAME

[75] Inventors: James R. Chesemore, Orange; Thomas C. Burns, Riverside, both of Calif.

[73] Assignee: Beckman Instruments, Inc., Fullerton, Calif.

[21] Appl. No.: 864,184

[22] Filed: Dec. 27, 1977

[51] Int. Cl.² .......................................... H01R 13/12
[52] U.S. Cl. .................................. 339/258 P; 29/856; 339/17 LC; 339/276 SF; 29/884
[58] Field of Search .................. 29/627, 628, 630 A; 339/17 E, 17 L, 17 LC, 17 CF, 176 MP, 176 MF, 218 R, 218 M, 276 SF, 258 R, 258 P, 258 F

[56] References Cited

U.S. PATENT DOCUMENTS

| 3,158,418 | 11/1964 | Rush | 339/17 L |
| 3,544,857 | 12/1970 | Byrne et al. | 29/627 |
| 3,808,578 | 4/1974 | Hansen | 339/176 MP |
| 3,864,008 | 2/1975 | Bakermans et al. | 339/276 SF |

FOREIGN PATENT DOCUMENTS

| 2435399 | 2/1976 | Fed. Rep. of Germany | 339/176 MP |
| 1467190 | 12/1966 | France | 339/17 C |

Primary Examiner—Joseph H. McGlynn
Attorney, Agent, or Firm—R. J. Steinmeyer; F. L. Mehlhoff; William H. May

[57] ABSTRACT

A carrier strip assembly of continuous length having transversely mounted round lead wires with an integrally formed resilient clamp on each end of each lead wire for connection with an electrical component substrate. The carrier strip provides the transporting means for the attached electrical component substrate for the assembly stages of the electrical component. The lead wires are severed from the carrier strip portion to provide outwardly extending round lead pins or external connects for interface with an electrical circuit assembly. The method for making the carrier strip assembly is disclosed.

13 Claims, 13 Drawing Figures

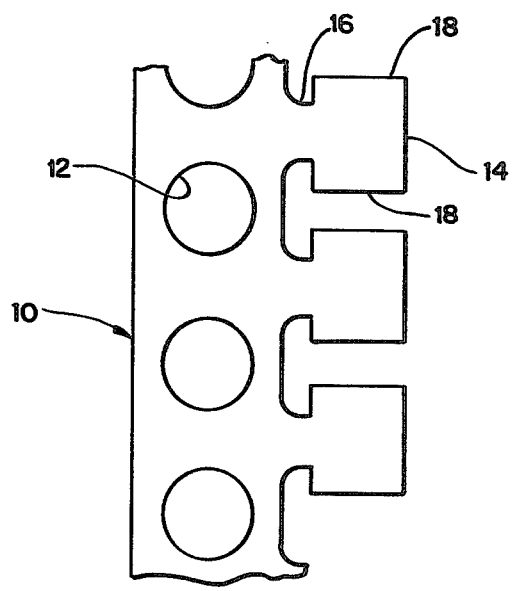
FIG. 1
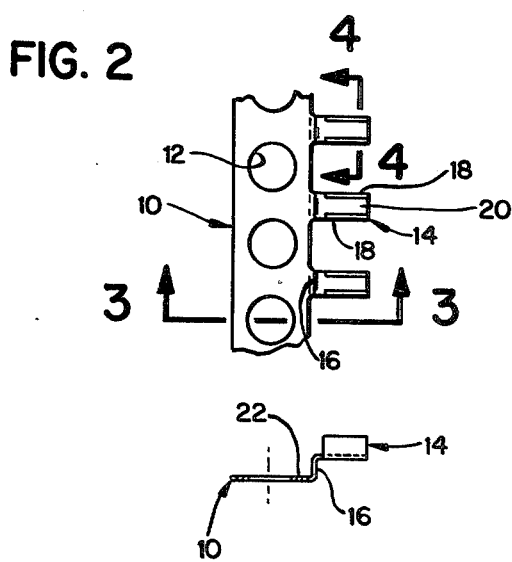
FIG. 2
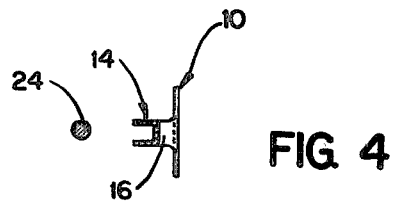
FIG. 3
FIG. 4

CARRIER STRIP FOR ROUND LEAD PINS AND METHOD FOR MAKING THE SAME

BACKGROUND OF THE INVENTION

The present invention relates to a carrier strip assembly as well as the interface between the lead pins on the carrier strip assembly and an electrical component package. More particularly, this invention relates to a carrier strip assembly which has round lead wires with integrally formed clamps on the free ends of the lead wires for connection to electrical component packages. The present invention is also directed to the method of fabricating the carrier strip or lead frame assembly having the round lead wires with integrally formed clamps on their free ends.

Inherent in the competitive environment of manufacturing electronic products is the utilization of low-cost rapid high volume manufacturing processes. A widely practiced approach to the assembly of electrical component packages having in-line pin devices for connection to various circuit assemblies or subassemblies is the attachment of a lead frame carrier or carrier strip assembly to the electrical component substrate to facilitate a continuous automated process. The carrier strip assembly includes the leads which are to be attached to the electrical component.

Generally, the carrier strip is made by stamping or etching some type of continuous band of thin gauge metal into a particular form wherein the strip becomes not only the carrying mechanism for the electrical component during its assembly, but also a source of the lead pins for the electronic component device. The typical presently used carrier strip assembly has the lead pins integrally formed thereon and they have a generally rectangular or square cross-sectional shape. However, in some instances it is desirable for the lead pins to have a round or circular cross-sectional shape.

It is recognized that in some electrical component modules straight rond lead wire pins have been utilized. However, these pins are generally affixed to the large area surface of the component substrate and are positioned along one edge of the substrate, so that the pin is offset from the centerline of the edge thickness of the substrate. In the construction of electrical component packages, having a substrate to which lead pins are connected, it is important that the longitudinal centerline of the pin be aligned with the centerline or center of the substrate edge thickness. Otherwise, the lead pins become offset from the center of the substrate edge thickness and present an unbalanced non-symmetrical lead pin arrangement with respect to the edge of the component package. This offset arrangement of the lead pins requires more room on the board assembly to which the component is attached. Also, the offset pins may cause more stress on the pin/substrate connection when the lead pins are inserted into a board assembly.

The typical rectangular cross-sectionally shaped lead pins which are formed on the carrier strip normally require the incorporation of tie bars adjacent the free ends of the lead wires to maintain their proper location with respect to each other. This necessitates the additional step of cutting away the tie bars after the component has been assembled.

SUMMARY OF THE INVENTION

The carrier strip assembly of the present invention utilizes a series of suitable lengths of round wire transversely mounted upon a continuous longitudinally traversing band wherein the outer ends of the round wire leads have a clamping connection integrally formed thereon for attachment to the edge of the electronic component substrate. The present invention also provides the method for making this improved carrier strip incorporating a series of round wire leads.

The utilization of the present invention provides for the placement of round lead wires on electrical components which are carried on a transporting carrier strip in such a manner that the longitudinal centerline of lead wires is aligned with the center of the edge thickness of the substrate. Once the assembly process is completed, the lead wires are cut from the carrier strip, resulting in each of the electrical component packages having one or more lead wires extending from its perimeter to provide connection into an assembly board.

Round lead wires allow the user to insert the wires in a board and bend them, not only at a right angle onto the board's opposing side, but also at any radial angle. On the other hand, rectangularly or square cross-sectionally shaped lead wires can be bent at a right angle onto the board's opposite side, but are limited in flexibility with respect to the radial direction they can be bent.

Round cross-sectional lead wires can be moved by aligning combs for proper positioning of the lead wires along the edge of the substrate, so that the need for tie bars is eliminated for round lead wires. Consequently, the additional step of removing the tie bars after completion of component assembly is eliminated.

Hence, the present invention combines the advantages of automated assembly of electrical component packages using a carrier strip assembly with the unique feature of being able to incorporate round lead wires in the carrier strip in such a manner that they can be connected to the packages in alignment with the center of the edge thickness of the substrate. In addition, the present approach of utilizing round lead wires with integrally formed connecting clamps provides a more efficient and inexpensive method of forming the overall electrical component package.

BRIEF DESCRIPTION OF THE DRAWINGS

FIG. 1 is a plan view showing the band portion of the carrier strip in the first stage of its formation;

FIG. 2 is a plan view of the carrier strip similar to FIG. 1 wherein the lead wire holder portions have been formed;

FIG. 3 is a sectional view taken along the lines 3—3 in FIG. 2;

FIG. 4 is a sectional view taken along the lines 4—4 in FIG. 2;

DETAILED DESCRIPTION OF THE INVENTION

Figure 5:
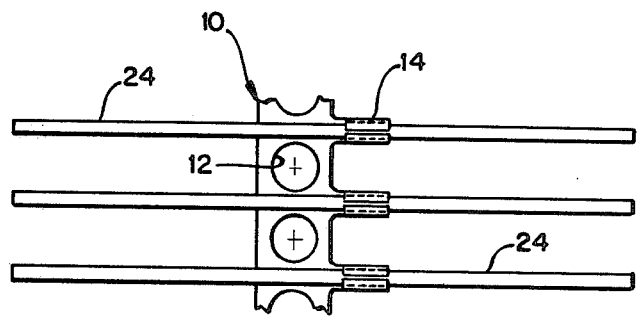
FIG. 5 is a plan view of a portion of the carrier strip band with the round lead wires traversely mounted on the carrier strip.

In the manufacture of the carrier strip assembly of the present invention, a long continuous band or strip of thin gauge metal 10 in FIG. 1 is subjected to a stamping or etching process to form a plurality of precisely spaced indexing holes 12, as well as a plurality of precisely spaced holder tabs 14 which will receive lead wires as will be explained. Each holder tab 14 contains a neck portion 16 and two flange sides 18. The indexing holes 12 are utilized in the overall automatic assembly of electronic components and interface with sprockets or other drive means to propel and control the movement of the carrier strip assembly.

As shown in FIG. 2, in the next stage of the formation of the carrier strip assembly the holder tabs 18 are bent upward in a vertical direction to be somewhat perpendicular to the central portion 20 of the holder 14.

As shown in FIG. 3, the neck portion 16 of the holder portion 14 is bent in a somewhat perpendicular direction with respect to the main portion 22 of the carrier strip assembly and also perpendicular to the bottom portion 20 of the holder 14. Consequently, the bottom portion 20 of the carrier holder 14 is slightly raised above and parallel to the main portion 22 of the carrier strip.

Figure 6:
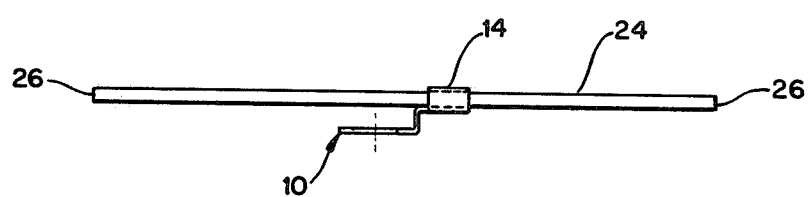
FIG. 6 is an end view of the carrier strip band with the lead wire mounted thereon.

In FIG. 4 the U-shaped or cup-shaped receptacle of the holder 14 is shown for receipt of the round lead wire 24. Reference is made to FIG. 5 showing the placement of lead wires 24 within the holder members 14. The flange members 18 of each holder 14 are crimped and pressed around the lead wires 24 to securely hold them in a precise location with respect to each other in a transverse orientation with respect to the carrier band or strip 10. The lead wires 24 have a round or circular cross-section. As the carrier strip 10 moves through the assembly process, the lead wires 24 are carried thereon with each lead wire 24 slightly raised above the main portion 22 of the carrier strip 10 as shown in FIG. 6.

Figure 8:
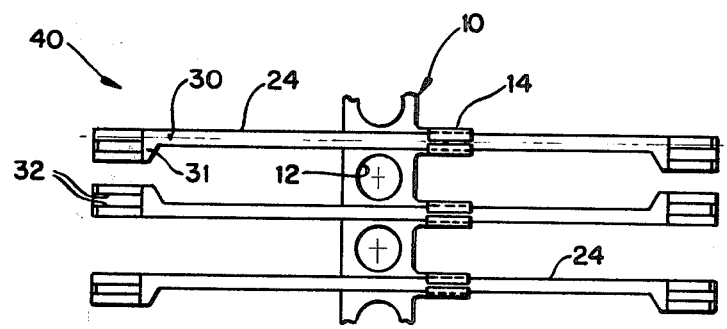
FIG. 8 is a plan view of the carrier strip assembly with the round lead wires having the free ends formed into trifurcated clamps.
Figure 7:
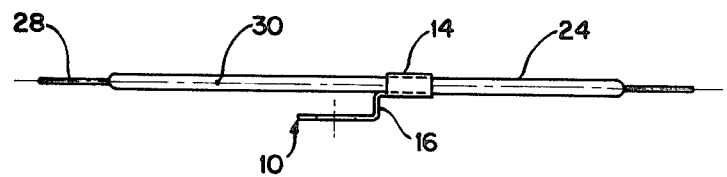
FIG. 7 is an end view of the lead wire with its ends formed into thin portions to form clamps.
Figure 9:
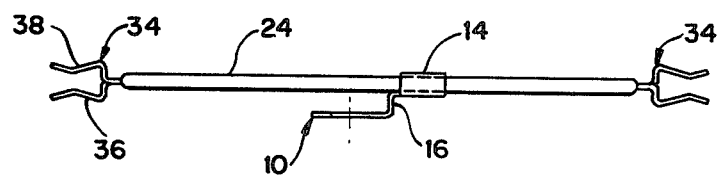
FIG. 9 is an end view of the carrier strip showing the general shape of the clamped ends of the lead wires.

The free ends 26 of the lead wires are inserted into a die form press to flatten the end of the wire as shown in FIG. 7 so that the flattened portion 28 is aligned with the longitudinal centerline 30 of the lead wire 24. The die is shaped so that the ends 26 of the wires are formed in the offset shape 31 as shown in FIG. 8 with one side of the flattened portion extending laterally further beyond the longitudinal centerline 30 of the lead wire than the other side of the centerline of the lead wire. This offset flattened portion 31 is placed in alternating sequence with respect to each adjacent wire as shown in FIG. 8. The next step which is accomplished within the same die forming process is to cut slits 32 into the flattened offset portion 31 of the ends of the lead wires. The cut ends of the lead wires are then formed to establish the clamp arrangement 34 shown in FIG. 9 with one or more bottom prongs or fingers 36 and one or more top prongs 38. Although a trifurcated clamp is shown in the Figures, it is envisioned that a two-prong or more than three-prong type of clamp could be utilized if desired.

When the clamps 34 are formed on the ends 26 of the lead wires, the carrier strip assembly 40 in FIG. 8 is completed and is ready for receipt of electrical component substrates. The carrier strip assembly 40 then moves the lead wires with their integrally formed trifurcated clamp ends 34 in FIG. 10 to a position adjacent electrical component substrate 42 which have contact pads 44 for interface with the clamp ends 34 of the lead wires in the carrier assembly 40. To insure the proper alignment between the clamps 34 and the contact pads 44, retractable combs or guide fingers are used to precisely position the lead wires to provide the necessary alignment with each respective contact pad 44. The round configuration of the lead wires enhances the guide combs' ability to precisely align each lead wire clamp. The use of guide combs to align the lead wires eliminates the need for tie bars on the lead wires.

Figure 11:
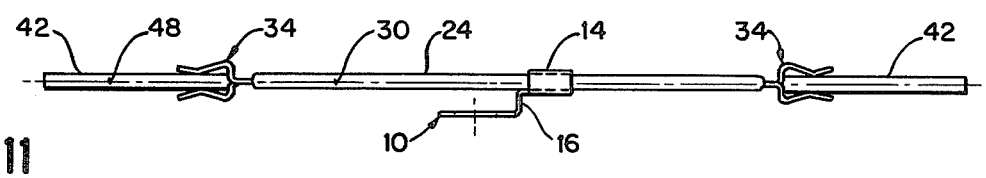
FIG. 11 is an end view showing the interface between the clamp end of the lead wires and the substrate.

The clamp 34 in FIG. 11 is designed in such a manner that when it is attached to the substrate 42, the centerline 30 of the wire is in alignment with the centerline 48 of the edge thickness 50 of the substrate 42. This is important with respect to the formation of the clamp 34, because the fingers or prongs 36 and 38 of the clamp must be formed in such a manner that they are equally spaced from the centerline 30 of the wire. This, therefore, provides the on-center alignment between the wire 24 and the edge 50 of the substrate in the electrical component.

As previously discussed, the offset die formed shape 31 of the lead wire end 26 which forms the clamp 34 is offset laterally from the lead wire centerline 30. The direction of the offset is alternated between successive lead wires 24 as shown in FIG. 8. The utilization of this offset arrangement with any given lead spacing and using an even number of leads minimizes the substrate length required. In other words, a component could be made so that the length of its substrate does not exceed the span between its first and last lead wire. The ultimate advantage of this arrangement is that the number of components that can be mounted in a board is maximized.

Figure 10:
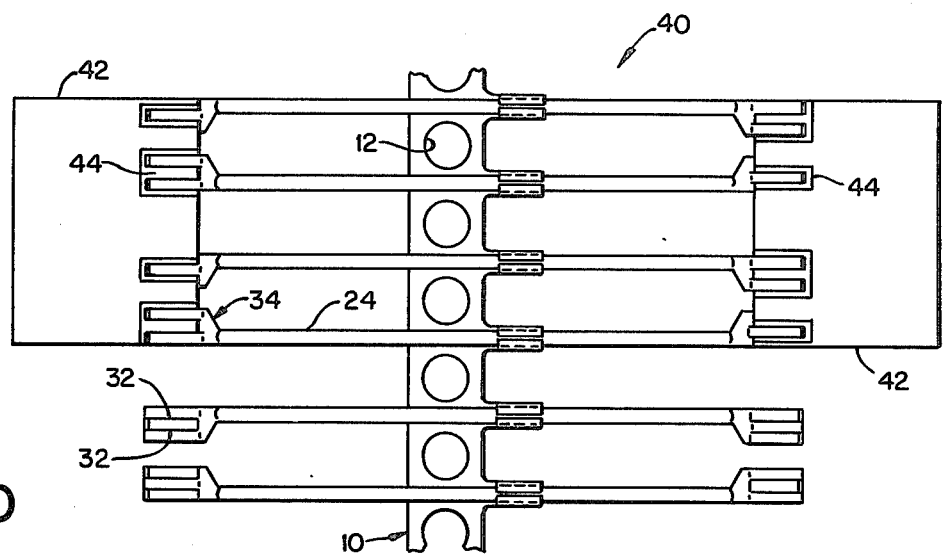
FIG. 10 is a plan view of the carrier strip assembly showing the attachment of the clamps of the lead wires to the electrical component substrate.

The electrical component substrates 42 are then moved by the carrier strip assembly 40 through the remaining processes in completing the construction of the electrical component. As shown in FIG. 10, both ends of each lead wire 24 have the trifurcated clamps 34, so that an electronic component 42 is carried on each end of the lead wires.

Figure 12:
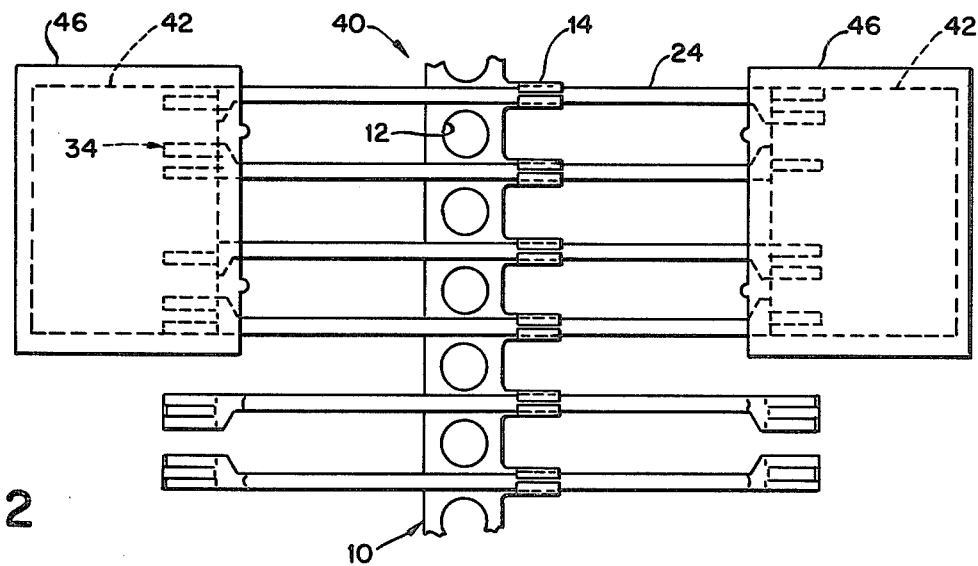
FIG. 12 is a plan view of the carrier strip showing the encapsulation of the electrical component substrate and the clamp end of the lead wires.
Figure 13:
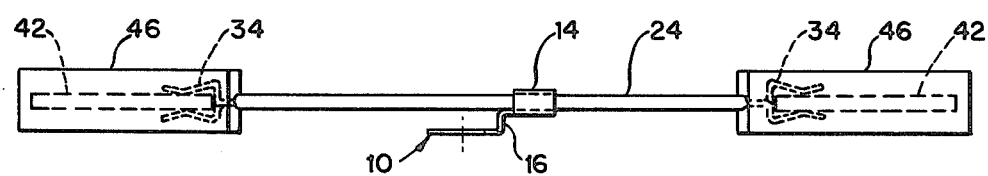
FIG. 13 is an end view showing the encapsulation of the interface between the clamp end of the lead wire and the component package.

As shown in FIGS. 12 and 13, the entire electrical component substrate package is preferably encapsulated with an insulating layer or cover 46 which encloses the interface between the substrate 42 and the clamp ends 34 of the lead wires. The elimination of the need for tie bars on the round lead wires enhances the molding process of encapsulating the substrate package. In the case of rectangular cross-sectional lead wires having tie bars any precision alignment of the individual lead wires with the openings in the mold is not possible. Consequently, is some instances the movement of the mold onto the substrate may pinch or damage a non-aligned lead wire. However, the use of round lead wires with no tie bars permits the use of additional aligning means for the individual lead wires prior to positioning of the mold around the substrate. The wires can be properly aligned and will not be damaged by the mold.

In some instances the substrate may be simply coated or dipped as opposed to complete molded encapsulation. After additional processing and curing of the package, the lead wires are severed at the desired length and the main portion 22 of the carrier strip is removed, leaving the lead pins extending from the electrical component package. These lead pins are then utilized to provide connection between the electrical component package and its insertion or connection to some other electrical subassembly or board.

What is claimed is:

1. An electrical component carrier strip assembly comprising:
   a central carrier band;
   a plurality of round wire segments transversely mounted on said band with each segment having a free end; and
   a clamp unitarily formed on the free end of each segment, said free ends being flattened and slitted to establish at least two fingers, said fingers being shaped to form top and bottom fingers of said clamp in such a manner that the longitudinal centerline of the wire is aligned midway between the opposing fingers of said clamp.

2. An electrical component comprising:
   a substrate;
   at least one electrical circuit element on said substrate;
   a round lead wire with one end connected to said substrate; and
   a clamp unitarily formed on said one end of said wire, said one end of said wire being flattened and slitted to establish at least two fingers, said fingers being shaped to form top and bottom fingers of said clamp in such a manner to provide the mechanical and electrical interface between said contact pad and said wire, the longitudinal centerline of the wire being substantially aligned with the centerline of the edge thickness of said substrate when said clamp connects to said substrate.

3. Method of forming a carrier strip assembly having a thin band with round wire leads, said method comprising the steps of:
   attaching said round wire leads to said thin band, each lead having at least one free end;
   flattening said free ends of said leads to form a flattened thin portion with a thickness less than the diameter of said leads;
   cutting said flattened thin portions to form a plurality of fingers;
   bending said fingers to form an integral clamp on said free end of said leads, at least two of said fingers opposing each other; and
   moving said clamp into engagement with a component substrate in such a manner that the centerline of said lead wire is aligned with the center of the edge thickness of said component substrate.

4. The method defined in claim 3 and additionally comprising the steps of:
   placing said clamp ends of said wire on said substrate in approximate position with terminal pads;
   precisely aligning said unsupported free ends of said leads on said substrate; and
   encasing said substrate and said clamp end of said lead in a dielectric material.

5. A method as defined in claim 3 and additionally comprising the step of encapsulating said component substrate and the clamp ends of each of said wires connected to said substrate.

6. A method as defined in claim 5 and additionally comprising the step of cutting said lead wires from said band.

7. Method of forming an indexed carrier strip assembly with round wire leads, said method comprising the steps of:
   stamping a thin metal band to form a plurality of indexing apertures in said band;
   forming a plurality of holding channels in said band;
   placing said round leads within said holding channels with each lead having at least one free end;
   securing said leads within said channels;
   shaping a free end of each round wire lead to form from the wire itself a clamp by flattening said free end, slitting said flattened free end and bending said free end to form top and bottom prongs, the center of opening of said clamp being substantially aligned with the center of the round wire; and
   moving said clamp ends of said lead wires into engagement with a component substrate in such a manner that the centerline of said lead wire is aligned with the center of the edge thickness of said component substrate.

8. The method as defined in claim 7 and additionally comprising the steps of:
   placing said clamp ends of said wire on said substrate in approximate position with terminal pads;
   precisely aligning said unsupported free ends of said leads on said substrate; and
   encasing said substrate and said clamp end of said lead in a dielectric material.

9. The method as defined in claim 7, wherein said flattened free end is slit and bent to form three or more top and bottom prongs.

10. The method as defined in claim 7, wherein one side of the flattened free end of each wire extends laterally farther away from the longitudinal centerline of the lead wire than the other side of said flattened free end to provide an offset of said flattened ends in alternating sequence with respect to each adjacent wire.

11. The method as defined in claim 7 and additionally comprising the step of encapsulating said component substrate and the clamp ends of each of said wires connected to said substrate.

12. The method as defined in claim 9 and additionally comprising the step of cutting said lead wires from said band.

13. An electrical lead assembly comprising:
    a flat electrical component substrate having a plurality of spaced electrical contacts on its surface;
    a plurality of spaced round wire conductors adapted to be in individual conducting relationship with the electrical contacts on the substrate surface, said round wire conductors lying in the plane of the substrate, substantially centered with respect to its adjacent edge;
    the end of each round wire conductor adjacent to the substrate having a unitarily formed clamp, said end of each round wire conductor being flattened and slitted to establish a plurality of flat resilient clamping fingers, said fingers being shaped to form top and bottom fingers of said clamp, said fingers clamping the edge of the substrate; and
    insulating material encapsulating the substrate and the adjacent ends of the round wire conductors.

* * * * *

UNITED STATES PATENT AND TRADEMARK OFFICE
CERTIFICATE OF CORRECTION

PATENT NO. : 4,196,959
DATED : April 8, 1980
INVENTOR(S) : Chesemore et al.

It is certified that error appears in the above-identified patent and that said Letters Patent are hereby corrected as shown below:

Claim 12, line 45, after "claim" delete "9" and insert --11--.

Signed and Sealed this

Eighth Day of July 1980

[SEAL]

Attest:

SIDNEY A. DIAMOND

Attesting Officer

Commissioner of Patents and Trademarks